United States Patent [19]

Neubauer et al.

[11] Patent Number: 5,328,797
[45] Date of Patent: Jul. 12, 1994

[54] PROCESS FOR PRODUCING A NEGATIVE-WORKING LITHOGRAPHIC PRINTING FORM UTILIZING SOLVENT MIXTURE OF MONO-($C_1$-$C_4$) ALKYL ETHER OF DIETHYLENE GLYCOL AND A SOLVENT HAVING BOILING POINT BETWEEN 50° AND 150° C.

[75] Inventors: Rudolf Neubauer, Oestrich-Winkel; Roman Keiper, Heidenrod; Siegfried Nuernberger, Eltville-Martinstal; Sabine Pilger, Bacharach-Steeg, all of Fed. Rep. of Germany

[73] Assignee: Hoechst Aktiengesellschaft, Frankfurt am Main, Fed. Rep. of Germany

[21] Appl. No.: 994,445

[22] Filed: Dec. 23, 1992

Related U.S. Application Data

[63] Continuation of Ser. No. 616,940, Nov. 21, 1990, abandoned.

Foreign Application Priority Data

Nov. 23, 1989 [DE] Fed. Rep. of Germany ....... 3938788

[51] Int. Cl.⁵ ............................................ G03C 1/74
[52] U.S. Cl. ................................... 430/169; 430/176; 430/177; 430/302
[58] Field of Search ............... 430/169, 176, 177, 302

[56] References Cited

U.S. PATENT DOCUMENTS

| | | |
|---|---|---|
| 3,790,385 | 2/1974 | Steppan et al. |
| 4,631,245 | 12/1986 | Pawlowski ..................... 430/175 |
| 4,717,640 | 1/1988 | Stahlhofen ..................... 430/192 |
| 4,822,713 | 4/1989 | Nishioka et al. ............... 430/175 |
| 4,917,988 | 4/1990 | Koizumi et al. ................ 430/169 |
| 4,929,533 | 5/1990 | Nishikawa et al. ............ 430/169 |

FOREIGN PATENT DOCUMENTS

| | | |
|---|---|---|
| 1146794 | 5/1983 | Canada . |
| 412765 | 2/1991 | European Pat. Off. . |
| 63-186248 | 8/1988 | Japan . |
| 1358923 | 7/1974 | United Kingdom . |
| 2204707 | 11/1988 | United Kingdom . |

*Primary Examiner*—Charles L. Bowers, Jr.
*Assistant Examiner*—Christopher G. Young
*Attorney, Agent, or Firm*—Foley & Lardner

[57] ABSTRACT

The present invention relates to a process for producing a negative-working photosensitive lithographic printing form, in which a negative-working photosensitive mixture which is dissolved in a solvent mixture and which contains a negative-working photosensitive compound and a polymeric binder which is insoluble in water but soluble in aqueous alkaline solution is applied to a base and the layer obtained is subsequently dried, which process comprises using a mixture of more than 2% by weight of at least one monoether of diethylene glycol with one or more organic solvent(s) having a boiling point below 200° C. as the solvent mixture.

8 Claims, No Drawings

PROCESS FOR PRODUCING A NEGATIVE-WORKING LITHOGRAPHIC PRINTING FORM UTILIZING SOLVENT MIXTURE OF MONO-($C_1$-$C_4$) ALKYL ETHER OF DIETHYLENE GLYCOL AND A SOLVENT HAVING BOILING POINT BETWEEN 50° AND 150° C.

This application is a continuation of application Ser. No. 07/616,940, filed Nov. 21, 1990, now abandoned.

BACKGROUND OF THE INVENTION

The present invention relates to a process for producing a negative-working photosensitive lithographic printing form, in which a negative-working photosensitive mixture which is dissolved in a solvent mixture and which contains a negative-working photosensitive compound and a polymeric binder which is insoluble in water but soluble in aqueous alkaline solution is applied to a base and the layer obtained is subsequently dried.

In the production of lithographic printing forms, the photosensitive mixtures are continuously applied to a base. The coated base is then dried to produce a thin film having uniform thickness. The solvent or solvent mixture should therefore dry on uniformly after coating and exhibit a good surface finish (surface cosmetic), i.e. suppress the occurrence of "fish eyes" precipitates and "clouds". In addition, the solvent or solvent mixture must be capable of evaporating without forming a large residue.

The requirements imposed on a suitable solvent or solvent mixture are limited not only to the immediate period of time which relates to the drying of the mixture, but also to the properties of the solution before application to the base. In this connection, it should be specified in the first place that all the layer constituents are soluble ideally in the necessary concentration. In addition, the solvent or solvent mixture must guarantee a solution stability over a certain period of time - preferably over a few days - without decompositions, precipitates and condensation reactions occurring. In addition, inexpensive availability and as low a toxicity as possible are required.

DE-A 2,034,655 (=US-A 3,790,385) proposes a solvent mixture for a negative-working photosensitive copying material which, according to the examples described therein, is composed of ethylene glycol monomethyl ether, tetrahydrofuran and butyl acetate. That is to say, all of the solvents in the mixture have boiling points below 140° C. It emerged, however, that negative-working photosensitive mixtures which contain such solvent mixtures are less durable, i.e. that precipitates and decompositions appear after only hours. In addition, it is found that the coating and drying properties are only partly advantageous.

DE-A 3,627,585 describes a process for producing presensitized lithographic printing forms based on negative-working photosensitive mixtures in which the photosensitive diazonium resin and the high-molecular-weight binder which is soluble in aqueous alkali can be dissolved in a plurality of different solvents with various boiling points. Mixtures of these solvents are also described.

In particular, mixtures of solvents are described in EP-A 0,184,804 and 0,152,819 (=US-A 4,631,245) (2-methoxyethanol with tetrahydrofuran) and EP-A 0,031,481 (butyl acetate, 2-methoxyethanol and tetrahydrofuran).

DE-A 3,807,406 (=GB-A 2,204,707) discloses a solvent mixture for negative-working photosensitive lithographic plates which comprises 1-methoxy-2-propanol, methyl lactate and methyl ethyl ketone. Up to 2% of a higher-boiling solvent can be added to these low-boiling solvents. With the solvent mixtures described, however, it was not possible to obtain homogeneous solutions. Some of the solids remain behind undissolved.

Seen as a whole, according to the prior art, only very dilute solutions of the layer constituents can be produced, with the result that very large amounts of solvent are required to dissolve all the layer constituents. Layers produced with a solvent mixture also exhibit, on the one hand, layer precipitates, layer defects and cloudy appearance during the drying process. This is associated with a short shelf life of the photosensitive solutions. Frequently, crystallization of layer constituents also occurs, even with a slight reduction in temperature.

SUMMARY OF THE INVENTION

Accordingly, it is an object of the present invention to provide a process for producing a negative-working photosensitive lithographic printing form that yields forms that have good surface finish and appearance and are free from layer defects and crystallization.

Another object of the present invention is to provide a process in which the solvent is capable of evaporating without forming a large residue.

A further object of the present invention is to provide a process employing a highly durable solvent mixture of low toxicity.

Yet another object of the present invention is to provide a process that avoids other of the foregoing disadvantages of the known processes.

Still another object of the present invention is to provide an improved printing form using the improved process.

An additional object of the present invention is to provide an improved solvent mixture for use in the improved process.

In accomplishing the foregoing objectives, there has been provided, in accordance with one aspect of the present invention, a process for producing a negative-working photosensitive lithographic printing form comprising the steps of providing a solvent mixture comprising more than 2% by weight of at least one monoether of diethylene glycol and at least one organic solvent having a boiling point below 200° C., dissolving a negative-working photosensitive mixture which contains a negative-working photosensitive compound and a polymeric binder which is insoluble in water but soluble in aqueous alkaline solution in the solvent mixture, applying said photosensitive mixture dissolved in the solvent mixture to a base to form a layer, and drying the layer.

In accordance with another aspect of the present invention there is provided a solvent mixture for producing a negative-working photosensitive lithographic printing form comprising more than 2% by weight of at least one monoether of diethylene glycol, and at least one organic solvent having a boiling point below 200° C.

In accordance with still another object of the present invention, there is provided a negative-working photosensitive lithographic printing form produced by a process as described above.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The solvent mixtures of the present invention do not have the disadvantages of the mixtures of the prior art. On the contrary, they result in stable photosensitive solutions having the desired higher concentrations, they make possible a uniform drying-on process without premature precipitation of layer constituents and with a hitherto unachievably uniform surface and they make possible the production of lithographic printing forms with a uniform pattern of properties in relation to photo-sensitivity, development capability and absence of tint in the printing process.

Preferred in particular are monoalkyl ethers of diethylene glycol, preferably the mono($C_1$–$C_4$) alkyl ethers. Among these, mention may be made of diethylene glycol monomethyl ether, diethylene glycol monoethyl ether, diethylene glycol monopropyl ether, and also corresponding monobutyl ethers. The monoalkyl ethers mentioned have a boiling point above 200° C.

Low-boiling organic solvents having a boiling point below 200° C. are used as further solvent constituents of the mixture used according to the invention. In particular, the low-boiling solvents have a boiling point of about 50° to 150° C., preferably 50° to 100° C. These may be one or more solvents from the group of solvents comprising acetone, 2-butanone, methanol, ethanol, n-propanol, isopropanol, n-butanol, 2-methoxyethanol, 1-methoxy2-propanol, 2-methoxy-1-propanol, amyl alcohol, tetrahydrofuran, 1,4-dioxane, water, toluene, diethyl ether, diisopropyl ether, dibutyl ether, 2-methylfuran, cyclohexanone, methyl isobutyl ketone, methyl propyl ketone, methyl isopropyl ketone, methyl butyl ketone, ethyl formate, propyl formate, butyl formate, methyl acetate, ethyl acetate, propyl acetate, butyl acetate, methyl propionate, ethylene glycol dimethyl ether, ethylene glycol diethyl ether, dimethyl sulfoxide, dimethylformamide, γ-butyrolactone and diacetone alcohol.

Of the high-boiling monoalkyl ethers, the mono($C_1$–$C_4$)alkyl ethers of diethylene glycol are particularly preferred.

Of the low-boiling solvents, in particular those having a boiling point below 200° C., tetrahydrofuran, 2-butanone and ethanol should be mentioned.

Preferred in particular are mixtures of a solvent of the type of a monoether of diethylene glycol with one or two solvent(s) of a low boiling point below 200° C. The higher-boiling monoether of diethylene glycol is present in a concentration of more than about 2% by weight, preferably in a concentration of about 2% by weight to about 50% by weight, based on the total weight of the solvent mixture. In particular, the mixing ratio of the high-boiling monoether of diethylene glycol to the low-boiling solvent is about 1:1 to 0.2:1, preferably about 1:1 to 0.4:1 (weight ratios).

The layer composition of suitable photosensitive mixtures has been known for a long time. Here only DE-A 2,034,654 (=GB-A 1,358,923) and EP-A 0,152,819 should be mentioned as representative.

In the process according to the invention, diazonium salt polycondensation products, i.e. condensation products of condensable aromatic diazonium salts, for example of diphenylamine-4-diazonium salts, with aldehydes, preferably formaldehyde, are preferably used as photosensitive compounds. Use is made with particular advantage of co-condensation products which contain, in addition to the diazonium salt units, still other non-photosensitive units which are derived from condensable compounds, in particular aromatic amines, phenols, phenol ethers, aromatic thioethers, aromatic hydrocarbons, aromatic heterocycles and carboxylic acid amides. These condensation products are described in DE-A 2,024,244. All the diazonium salt polycondensation products which are described in DE-A 2,739,774 (=U.S. 4,186,017) are generally suitable.

The diazonium salt units A—$N_2$X are preferably derived from compounds of the formula ($R^8$—$R^9$—)$_p$$R^{10}$—$N_2$X, where X is the anion of the diazonium compound,
p is an integer from 1 to 3,
$R^8$ is an aromatic radical containing at least one position capable of condensation with an active carbonyl compound,
$R^{10}$ is a phenylene group,
$R^9$ is a single bond or one of the groups:

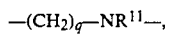

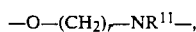

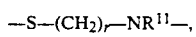

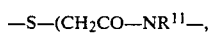

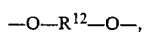

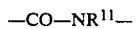

wherein
q is a number from 0 to 5,
is a number from 2 to 5,
$R^{11}$ is hydrogen, an alkyl group containing 1 to 5 carbon atoms, an aralkyl group containing 7 to 12 carbon atoms or an aryl group containing 6 to 12 carbon atoms, and
$R^{12}$ is an arylene group containing 6 to 12 carbon atoms.

The photosensitive layer contains, in general, about 5 to 90, preferably about 10 to 70, % by weight of diazonium compound.

To stabilize the photosensitive mixture, it is advantageous to add a compound with an acid nature to it. Mineral acids and strong organic acids are suitable, and of these phosphoric acid, sulfuric acid, perchloric acid, boric acid or p-toluenesulfonic acid are preferred. A particularly well-suited acid is phosphoric acid.

Plasticizers, adhesion promoters, dyestuffs, pigments and color couplers may furthermore be added to the mixtures.

The nature and amount of these additions depends on the field of application envisaged for the photosensitive mixture. In this connection, it is always necessary to ensure that the substances added do not absorb an excessive proportion of the actinic light necessary for the crosslinking and thereby reduce the practical photosensitivity.

The photosensitive mixtures used in the process according to the invention may furthermore contain dyestuffs and/or pigments which may act both as contrast agents and as layer consolidators. Suitable dyestuffs are, for example, specified in US-A 3,218,167 and 3,884,693. Particularly suitable are, for example, Victoria pure blue FGA, Renol blue B2GH (C.I. 74160), crystal violet or rhodamine 6 GDN (C.I. 45160). To increase the image contrast after exposure, metanil yellow (C.I. 13065), methyl orange (C.I. 13025) or phenylazodiphenylamine may be used.

Polymerizable compounds which contain at least one photooxidizable and possibly at least one urethane group in the molecule may also be used. Such monomers are described in DE-A 3,710,279, 3,710,281 and 3,710,282.

The compounds described in the earlier German Patent Applications P 38 25 836.6 (corresponding to U.S. patent application Ser. No. 07/381,832) and P 38 32 032.0 (corresponding to U.S. patent application Ser. No. 07/410,267) and containing photooxidizable groups can also be used.

A multiplicity of substances can be used as photoinitiators. Examples are those which are derived from a parent compound such as benzophenone, acetophenone, benzoin, benzil, benzil monoketal, fluorenone, thioxanthone, polynuclear quinone, acridine and quinazoline; and also trichloromethyl-s-triazines, 2-halomethyl-5-vinyl-1,3,4-oxadiazole derivatives, halooxazoles substituted with trichloromethyl groups or carbonylmethylene heterocycles containing trihalomethyl groups, such as are described in DE-A 3,333,450.

Preferred photoinitiators are photoreducible dyestuffs, in particular in combination with trihalomethyl compounds which are split on exposure to light, and possibly with acridine, phenazine or quinoxaline compounds which are active as photoinitiators, such as are described in DE-A 3,710,281 and 3,710,282.

The total amount of polymerization initiators is, in general, about 0.05 to 20, preferably about 0.1 to 10% by weight.

Depending on the planned application and on the desired properties, the photopolymerizable layers may contain diverse substances as additives. Examples are: inhibitors to prevent thermal polymerization of the monomers, hydrogen donors, dyestuffs, dyed and undyed pigments, color couplers, indicators, plasticizers and chain transfer agents. These constituents should expediently be so selected that they have as low an absorption as possible in the actinic radiation range which is important for the initiation process.

The developer according to the invention is also suitable for developing negative-working, photosensitive layers which contain both a diazonium salt polycondensation product and also a photopolymerizable compound.

Examples of usable binders are chlorinated polyethylene, chlorinated polypropylene, alkyl poly(meth)acrylates in which the alkyl group is, for example, methyl, ethyl, n-butyl, i-butyl, n-hexyl or 2-ethylhexyl, copolymers of the said alkyl (meth)acrylates with at least one monomer such as acrylonitrile, vinyl chloride, vinylidene chloride, styrene or butadiene; polyvinyl chloride, vinyl chloride/acrylonitrile copolymers, polyvinylidene chloride, vinylidene chloride/acrylonitrile copolymers, polyvinyl acetate, polyvinyl alcohol, polyacrylonitrile, acrylonitrile/styrene copolymers, acrylonitrile/butadiene/styrene copolymers, polystyrene, polymethylstyrene, polyamides (for example nylon-6), polyurethanes, methylcellulose, ethylcellulose, acetylcellulose, polyvinyl formal and polyvinyl butyral.

Particularly suitable are binders which are insoluble in water, soluble in organic solvents and soluble or at least swellable in aqueous alkaline solutions.

Particular mention should be made of binders containing carboxyl groups, for example copolymers of (meth)acrylic acid and/or its unsaturated homologs such as crotonic acid, copolymers of maleic anhydride or its half-esters, reaction products of polymers containing hydroxyl groups with dicarboxylic acid anhydrides and also mixtures thereof.

Furthermore, reaction products of polymers which carry H-acid groups which have been completely or partially reacted with activated isocyanates such as, for example, reaction products of polymers containing hydroxyl groups with aliphatic or aromatic sulfonyl isocyanates or phosphinic acid isocyanates are suitable.

In addition, the following are suitable: polymers containing hydroxyl groups such as, for example, copolymers of hydroxyalkyl (meth)acrylates, copolymers of allyl alcohol, copolymers of vinyl alcohol, polyurethanes or polyesters and also epoxy resins, provided they carry an adequate number of free OH groups or have been so modified that they are soluble in aqueous alkaline solutions, or those polymers which carry aromatically bound hydroxyl groups such as, for example, condensation products of condensable carbonyl compounds, in particular formaldehyde, acetaldehyde or acetone, with phenols, or copolymers of hydroxystyrenes. Finally, copolymers of (meth)acrylamide with alkyl (meth)acrylates can also be used.

The polymers described above are suitable, in particular, if they have a molecular weight of between about 500 and 200,000 or more, preferably about 1,000 to 100,000 and either have acid values of between about 10 and 250, preferably from about 20 to 200, or hydroxyl values of between about 50 and 750, preferably from about 100 to 500.

As preferred alkali-soluble binders, those below may be mentioned: copolymers of (meth)acrylic acid with alkyl (meth)acrylates, (meth)acrylonitrile or the like, copolymers of crotonic acid with alkyl (meth)acrylates, (meth)acrylonitrile or the like, copolymers of vinylacetic acid with alkyl (meth)acrylates, copolymers of maleic anhydride with optionally substituted styrenes, unsaturated hydrocarbons, unsaturated ethers or esters, esterification products of copolymers of maleic anhydride, esterification products of polymers containing hydroxyl groups with anhydrides of di- or polycarboxylic acids, copolymers of hydroxyalkyl (meth)acrylates with alkyl (meth)acrylates, (meth)acrylonitrile or the like, copolymers of allyl alcohol with optionally substituted styrenes, copolymers of vinyl alcohol with alkyl (meth)acrylates or other unsaturated compounds capable of polymerization, polyurethanes provided they contain an adequate number of free OH groups, epoxy resins, polyesters, partially saponified vinyl acetate copolymers, polyvinyl acetals containing free OH groups, copolymers of hydroxystyrenes with alkyl (meth)acrylates or the like, phenol-formaldehyde resins, for example novolaks.

The amount of the binder in the photosensitive layer is, in general, about 20 to 90, preferably about 40 to 80% by weight.

Suitable bases to which the photosensitive mixture used in the process according to this invention is applied are those which have a high dimensional stability. These usually include printing plate bases. Paper, aluminum or its alloys, including those which are laminated with a plastic film, for example with polyethylene terephthalate or cellulose acetate, metal plates such as steel, zinc and copper plates and also plastic films are suitable. Particularly preferred are aluminum bases.

Of the aluminum bases, those are preferred whose surfaces have been roughened. Various graining processes known to persons skilled in the art are available, in particular mechanical, chemical and electrolytic, and also combined processes. Subsequently, an anodic oxidation of the surface can be carried out using acids such as sulphuric, phosphoric or nitric acid, etc., with direct current or alternating current. In particular the aluminum surfaces pretreated in this way are aftertreated with polyvinyl phosphonic acid (DE-C 1,134,093, GB-A 1,230,447).

However, other aftertreatment methods are also possible, such as, for example, with a silicate, potassium fluorozirconate, phosphomolybdate, a polyacrylic acid, phosphonic acid or phytic acid. Particularly preferred is aftertreatment with a 0.1%-strength aqueous solution of polyvinyl phosphonic acid.

The negative-working photosensitive mixture used in the process according to the invention is applied in an amount of about 0.3 to 5.0 g/m$^2$, in particular about 0.5 to 3.5 g/m$^2$, based on the total constituents of the photosensitive mixture, to the base. The photosensitive mixture is applied by known processes, such as spray coating, spin coating, application by means of a bar or by curtain coating. Predrying at a low temperature is possible.

After drying, the photosensitive copying material used according to the invention is exposed to actinic light. Within the scope of this description actinic radiation should be understood to mean any radiation whose energy is equivalent at least to that of visible light. Suitable, in particular, are visible light and long-wave UV radiation, but also short-wave UV radiation and also laser, electron and X-ray radiation. The photosensitivity ranges from about 200 nm up to 800 nm and consequently spans a very wide range.

As a result of the wide spectral sensitivity of the copying material used according to the invention, any light source familiar to the person skilled in the art, for example tubular lamps, xenon pulse lamps, metal halide doped mercury high pressure lamps and carbon arc lamps, can be used. In addition, exposure in standard projection and enlargement apparatuses under the light of metal filament lamps and contact exposure with normal incandescent bulbs is possible with the photosensitive mixtures according to the invention. The exposure can also be carried out with coherent light from a laser. Suitable for the purposes of the present invention are lasers of the correct power, for example argon ion, krypton ion, dyestuff, helium/cadmium and helium/neon lasers which emit, in particular, between about 150 and 650 nm. The laser beam can be guided by means of a pre-programmed line and/or dotwise movement.

As possible applications for the material according to the invention, mention may be made of the following: copying layers for the photomechanical production of printing forms for letterpress printing, lithography, gravure printing and screen printing, and also of embossed copies for example for the production of texts in braille, of individual copies, tanned images, carbon images etc. The mixtures can furthermore be used for the photomechanical production of etch resists, for example for producing name plates, and of printed circuits, and for chemical milling. The mixtures according to the invention have particular significance as copying layers for producing lithographic plates and for the photoresist technique.

To utilize the layer better, an afterheating may follow the exposure. For the purpose of development, the plate is treated with a suitable developer solution, for example with organic solvents, but preferably with a weakly alkaline aqueous solution. The pH of the developer is about 8 to 12. The developer solution may contain a small proportion, preferably less than 2% by weight, of organic solvents miscible with water.

Exemplary embodiments of the invention are specified below. In these, parts by weight (pbw) and parts by volume (pbv) are in the ratio of g to cm$^3$. Percentage and quantitative ratios are to be understood in units of weight, unless otherwise specified.

The following non-limiting examples illustrate the invention:

EXAMPLE 1

50 pbw of a polyvinyl butyral having a molecular weight of about 70,000 to 80,000, which contains 71% vinyl butyral, 2% vinyl acetate and 27% vinyl alcohol units, and 4 pbw of maleic anhydride are dissolved in 725 pbw of methyl ethyl ketone while heating. 1 pbw of triethylamine is added to the clear solution and the solution is heated for five hours under reflux. After cooling, the solution is filtered and added dropwise to 10,000 pbw of distilled water, a white fibrous product being obtained which is filtered off by suction and dried to constant weight in vacuo at 40° C.

The yield is 52 pbw of the polymer (analysis: C 61.9%; H 9.3%) with an acid value of 30.

A coating solution composed of

| | |
|---|---|
| 62 | pbw of the polymer described above, |
| 21 | pbw of a diazonium salt polycondensation product prepared from 1 mol of 3-methoxydiphenyl-amine-4-diazonium sulfate and 1 mol of 4,4'-bis-(methoxy)diphenyl ether in 85%-strength phosphoric acid and isolated as mesitylene sulfonate, |
| 2.5 | pbw of phosphoric acid (85%), |
| 3 | pbw of Victoria pure blue FGA (C.I. Basic Blue 81) and |
| 0.7 | pbw of phenylazodiphenylamine in |
| 1,600 | pbw of diethylene glycol monomethyl ether and |
| 1,750 | pbw of tetrahydrofuran | is applied to an aluminum foil which has been roughened by brushing with an aqueous abrasive suspension and pretreated with a 0.1%-strength aqueous solution of polyvinyl phosphonic acid, and is then dried.

The copying layer obtained in this way, which has a layer weight of 0.95 g/m² is exposed under a negative master for 30 s to a metal halide lamp with a power of 5 kW.

The exposed layer is treated with a developer solution of the following composition

| 5 | pbw of sodium octyl sulfate, |
|---|---|
| 1.5 | pbw of sodium metasilicate pentahydrate, |
| 1 | pbw of trisodium phosphate dodecahydrate, |
| 0.5 | pbw of disodium hydrogenphosphate dodecahydrate, and |
| 92 | pbw of water | using a plush tampon, in which process the unexposed layer regions are cleanly removed, and then rinsed with water and dried.

In the copy, the fourth step of a silver film continuous tone step wedge having a density range from 0.15 to 1.50, the density increments being 0.15, is still completely covered.

The offset printing plate obtained in this way yields many thousands of tint-free clean impressions on a sheet-fed offset press.

EXAMPLE 2

24 pbw of a copolymer of styrene and allyl alcohol, which contains 54% allyl alcohol units and has an OH value of 192 are dissolved in 350 pbw of methyl ethyl ketone. 1 pbw of maleic anhydride is added to the clear solution. After the latter has dissolved, 0.5 pbw of triethylamine are added and the mixture is heated to reflux temperature. After refluxing it for five hours, the largely clear solution is cooled, filtered and then added dropwise to 5,000 pbw of distilled water. The powdery white product obtained is filtered off by suction and dried as in Example 1.

The yield is 25 pbw of the polymer, which has an acid value of 16.

A coating solution composed of

| 86.5 | pbw of the binder described above, |
|---|---|
| 29 | pbw of the diazonium salt polycondensate described in Example 1, |
| 3.5 | pbw of phosphoric acid (85%) |
| 4.3 | pbw of Victoria pure blue FGA and |
| 2,000 | pbw of diethylene glycol monomethyl ether, |
| 2,000 | pbw of ethanol and |
| 600 | pbw of 2-butanone | is applied to an aluminum foil which has been electrochemically roughened in nitric acid and then anodized and which has been aftertreated with polyvinyl phosphonic acid. The dry weight is 1.02 g/m².

Exposure and processing are as specified in Example 1. After inking, a printing form is obtained which has good ink absorption and whose non-image areas do not take up greasy ink.

After mounting the printing form in a sheetfed offset press, many thousands of good impressions are obtained.

EXAMPLE 3

An aluminum foil, the surface of which has been roughened mechanically by wire brushing, is coated with a solution of 20 g of 2,4-bis(2'-chlorophenyl)-5-(4-diethylaminophenyl)-(1,3)-oxazole and 30 g of a copolymer of styrene and maleic anhydride in 200 ml of diethylene glycol monomethyl ether and 250 ml of 2-butanone, to which solution 20 ml of a methanolic sensitizer solution containing 1 g of Astrazon yellow 7 GLL (C.I. Basic Yellow 21) and 0.1 g of rhodamine FB (C.I. 45 170) have been added. After the solvents have been evaporated, a photoconductor layer about 5 μm thick is obtained which is charged up in the dark to about 450 V negative using a corona. The charged-up photoconductor layer is exposed in a repro camera, the exposure time being 15 s if 8 Autophot lamps, each 500 W, are used.

The master used is a standard newspaper-printing pasteup with blue alignment lines and stuck-in yellowed text excerpts. After developing the latent charge image produced by the exposure with a commercial toner, a clean, tone-free image of the master with well-defined edges is obtained which is fixed by exposure to heat. For the purpose of conversion to a printing form, the aluminum foil with the tonered photoconductor layer is placed in a cell which contains a solution of 35 g of sodium metasilicate 9-hydrate in 140 ml of glycerol having a water content of 20%, 550 ml of ethylene glycol and 140 ml of ethanol. After 1 min, the incipiently dissolved photoconductor layer at the untonered places is rinsed off with a water jet, rubbing gently. The plate is ready for printing. With the base material used, the print run is about 80,000. If the printing operation is only to be carried out later, the plate has to be preserved with a commercial preservative or gumming solution.

EXAMPLE 4

A solution composed of

| 4.0 | pbw of a copolymer of methyl methacrylate/methacrylic acid (82:18) having an acid value of 110, |
|---|---|
| 4.0 | pbw of trimethylolethane triacrylate, |
| 0.07 | pbw of 4-dimethylamino-4'-methyldibenzalacetone, |
| 0.1 | pbw of 9-phenylacridine, |
| 0.1 | pbw of 2,4-bis-trichloromethyl-6-(4-styrylphenyl)-2-triazine, |
| 0.04 | pbw of an azo dyestuff produced from 1,4-dinitro-6-chlorobenzenediazonium salt and 2-methoxy-5-acetylamino-cyano-ethyl-N-hydroxyethylaniline, |
| 24 | pbw of diethylene glycol monomethyl ether, |
| 24 | pbw of ethanol and |
| 7.3 | pbw of 2-butanone | is applied to electrolytically roughened and anodization-hardened 0.3 mm thick aluminum by spinning on and dried so that a layer weight of 2.5 g/m² is obtained.

After drying, the photopolymerizable layer is coated with a solution of 5 pbw of polyvinyl alcohol having a K-value of 8 and 12% unhydrolyzed acetyl groups in 95 pbw of softened water and dried so that a top layer of 2.5 g/m² is produced. Exposure is then carried out as in Example 1. After inking, a printing form is obtained which has good ink absorption and whose non-image regions do not absorb any greasy ink. After mounting the printing form in a sheet-fed offset press, many thousands of good impressions are obtained.

EXAMPLE 5

A photosensitive layer is produced from the following constituents:

| | | |
|---|---|---|
| 0.45 | pbw | of a copolymer of 82% methyl methacrylate and 18% methacrylic acid (acid value 117), |
| 1.05 | pbw | of a polymer prepared by reflux heating using polyvinyl butyral having a molecular weight of about 70,000 to 80,000, which contains 71% vinyl butyral, 2% vinyl acetate and 27% vinyl alcohol units, maleic anhydride, methyl ethyl ketone and trimethylamine, |
| 0.45 | pbw | of the diazonium salt polycondensation product as in Example 1, |
| 0.04 | pbw | of 85%-strength phosphoric acid, |
| 0.09 | pbw | of Victoria pure blue FGA (C.I. Basic Blue 81), |
| 1.5 | pbw | of pentaerythritol tetra-acrylate/triacrylate (technical mixture), |
| 0.007 | pbw | of phenylazodiphenylamine, |
| 0.12 | pbw | of 2-(4-styrylphenyl)-4,6-bis-trichloromethyl-s-triazine in |
| 24 | pbw | of diethylene glycol monoethyl ether and |
| 24 | pbw | of tetrahydrofuran and |
| 48 | pbw | of 2-butanone. |

The layer weight after drying is 1.8 g/m².

The plate is then coated with a 15%-strength aqueous solution of polyvinyl alcohol (12% residual acetyl groups, K-value 4). After drying, a top coat having a weight of 1 g/m² is obtained.

The further processing is as in Example 1. Several thousand perfect impressions can be made from the developed plate in an offset printing press.

COMPARISON EXAMPLE 1

(Solvent Mixture from DE-A 3,807,406)

Analogously to Example 1, a coating solution is prepared from

| | | |
|---|---|---|
| 62 | pbw | of the polymer from Example 1, |
| 21 | pbw | of the diazonium salt polycondensation product from Example 1, |
| 2.5 | pbw | of phosphoric acid (85%), |
| 3 | pbw | of Victoria pure blue FGA and |
| 0.7 | pbw | of phenylazodiphenylamine in |
| 905 | pbw | of 1-methoxy-isopropanol. |
| 1,100 | pbw | of methyl lactate, |
| 1,300 | pbw | of methyl ethyl ketone and |
| 45 | pbw | of diethylene glycol monomethyl ether. |

Unlike Example 1, it was not possible to obtain a homogeneous solution from the present mixture even with prolonged stirring. Some of the solids remain behind undissolved.

The solvent mixture used here and described in DE-A 3,807,406 having a content of higher-boiling diethylene glycol monomethyl ether of less than 2% by weight (1.3% by weight), based on the constituents of the solvent mixtures, therefore shows appreciable disadvantages compared with the one used according to the invention. It is completely surprising that an increase in the proportion of higher-boiling solvent was able to overcome these disadvantages.

COMPARISON EXAMPLE 2

(Solvent Mixture from DE-A 2,034,655)

Analogously to Example 1, a coating solution is prepared from

| | | |
|---|---|---|
| 62 | pbw | of the polymer from Example 1, |
| 21 | pbw | of the diazonium salt polycondensation product from Example 1, |
| 2.5 | pbw | of phosphoric acid (85%), |
| 3 | pbw | of Victoria pure blue FGA and |
| 0.7 | pbw | of phenylazodiphenylamine in |
| 2,010 | pbw | of ethylene glycol monomethyl ether, |
| 1,005 | pbw | of tetrahydrofuran and |
| 335 | pbw | of butyl acetate. |

The solvent mixture used here is known from DE-A 2,034,655. If the coating solution from Example 1 is compared with the one used here, the following is found:

The shelf life of the solution from Comparison Example 2 is substantially shorter than that of Example 1. The solution from the comparison example can only be used for a few hours because precipitates and decompositions of the constituents make the solution unusable. The solution from Example 1 remains, however, usable under the same conditions for several days.

In addition more solids, based on the solvent volume, can be dissolved with the aid of the solvent mixture used according to the invention. On comparing the coating and drying properties of the solvent mixtures, it is found that substantially more uniform coatings are to be obtained with the mixture used according to the invention. As a result it is possible to achieve an appreciably better uniformity and better printing quality when printing fine half-tone areas.

What is claimed is:

1. A process for producing a negative-working photosensitive lithographic printing form comprising the steps of:
   (a) providing a solvent mixture consisting essentially of, in admixture,
      (i) from about 10 to 50% by weight of at least one mono-($C_1$–$C_4$)alkyl either of diethylene glycol, and
      (ii) at lest one organic solvent having a boiling point between about 50 and 150° C.,
   (b) dissolving a negative-working photosensitive mixture which contains a negative-working photosensitive diazonium salt polycondensation product in an amount sufficient to cause a layer of the mixture to become insoluble when it is exposed to actinic radiation and a polymeric binder which is insoluble in water but soluble in aqueous alkaline solution in said solvent mixture, said binder being present in an amount sufficient to form a uniform layer of the mixture on a substrate,
   (c) applying said photosensitive mixture dissolved in said solvent mixture to a base to form a layer, and
   (d) drying said layer wherein said diazonium salt polycondensation product comprises
      (i) units derived form condensable compounds selected from the group consisting of aromatic amines, phenols, phenol ethers, aromatic thioethers, aromatic hydrocarbons, aromatic heterocyclics and organic acid amides, and (ii) units derived from compounds of the formula $(R^8-R^9-)_p R^{10}-N_2 X$, where X is the anion of the diazonium compound, p is an integer from 1 to 3, $R^8$ is an aromatic radical containing at least one position capable of condensation with an active carbonyl compound, $R^{10}$ is a phenylene group, $R^9$ is a single bond or one of the groups:

$-(CH_2)_q-NR^{11}-$, $-O-(CH_2)_r-NR^{11}-$, $-S-(CH_2)_r-NR^{11}-$, $-S-(CH_2CO-NR^{11}-$, $-O-R^{12}-O-$, $-O-$ $-S-$ or $-CO-NR^{11}-$ wherein q is a number from 0 to 5, r is a number from 2 to 5, $R^{11}$ is hydrogen, an alkyl group containing 1 to 5 carbon atoms, an aralkyl group containing 7 to 12 carbon atoms or an aryl group containing 6 to 12 carbon atoms, and $R^{12}$ is an arylene group containing 6 to 12 carbon atoms.

2. A process as claimed in claim 1, wherein the weight ratio of mono-($C_1$-$C_4$)alkyl either of diethylene glycol to the other organic solvents contained int eh mixture is about 1:1 to 0.2:1.

3. A process as claimed in claim 2, wherein the weight ratio of mono-($C_1$-$C_4$)alkyl either of diethylene glycol to the other organic solvents contained int eh mixture is about 1:1 to 0.4:1.

4. A process as claimed in claim 1, wherein the solvent having a boiling point between about 50 and 150° C. is selected from the group comprising the solvents: acetone, 2-butanone, methanol, ethanol, n-propanol, isopropanol, n-butanol, 1-methoxy-2-propanol, 2-methoxy-1-propanol tetrahydrofuran, water, methyl isobutyl ketone, methyl propyl ketone, methyl isopropyl ketone, methyl butyl ketone, ethyl formate, methyl acetate, ethyl acetate, propyl acetate, butyl acetate, ethylene glycol diemthyl ether, ethylene gylcol diethyl ether.

5. A process as claimed in claim 1, wherein the dry layer amount of the negative-working photosensitive mixture is about 0.3 to 5 g/m².

6. A process as claimed in claim 5, wherein the dry layer amount of the negative-working photosensitive mixture is about 0.5 to 3.5 g/m².

7. A process as claimed in claim 1, wherein the layer is dried at about 50 to 120° C.

8. A process as claimed in claim 1, wherein said binder contains carboxyl groups.

* * * * *

UNITED STATES PATENT AND TRADEMARK OFFICE
CERTIFICATE OF CORRECTION

PATENT NO. : 5,328,797
DATED : July 12, 1994
INVENTOR(S) : Rudolf NEUBAUER et al.

It is certified that error appears in the above-indentified patent and that said Letters Patent is hereby corrected as shown below:

Claim 1, Column 12, line 46, "alkyl either" should read --alkyl ether--;
Column 12, line 48, "at lest" should read --at least--.

Claim 2, Column 14, line 6, "alkyl either" should read --alkyl ether--;
Column 14, line 7, "int eh" should read --in the--.

Claim 3, Column 14, line 10, "alkyl either" should read --alkyl ether--;
Column 14, line 11, "int eh" should read --in the--.

Claim 4, Column 14, line 22, "diemthyl ether" should read --dimethyl ether--.

Signed and Sealed this

First Day of November, 1994

Attest:

BRUCE LEHMAN

*Attesting Officer*      *Commissioner of Patents and Trademarks*